(12) United States Patent
Watakabe et al.

(10) Patent No.: US 9,911,859 B2
(45) Date of Patent: Mar. 6, 2018

(54) THIN-FILM TRANSISTOR AND METHOD OF MANUFACTURING THE SAME FIELD

(71) Applicant: Japan Display Inc., Minato-ku (JP)

(72) Inventors: Hajime Watakabe, Minato-ku (JP); Arichika Ishida, Minato-ku (JP); Takashi Okada, Minato-ku (JP); Masayoshi Fuchi, Minato-ku (JP); Akihiro Hanada, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/944,711

(22) Filed: Nov. 18, 2015

(65) Prior Publication Data

US 2016/0149047 A1 May 26, 2016

(30) Foreign Application Priority Data

Nov. 25, 2014 (JP) .................. 2014-237936

(51) Int. Cl.
*H01L 29/10* (2006.01)
*H01L 29/786* (2006.01)
*H01L 29/66* (2006.01)

(52) U.S. Cl.
CPC .... *H01L 29/7869* (2013.01); *H01L 29/66969* (2013.01)

(58) Field of Classification Search
CPC ....................... H01L 29/7869; H01L 29/66969
See application file for complete search history.

(56) References Cited

U.S. PATENT DOCUMENTS

| | | | | |
|---|---|---|---|---|
| 2011/0253998 | A1* | 10/2011 | Theiss ................. | H01L 29/7869 257/43 |
| 2013/0126859 | A1* | 5/2013 | Yeh ...................... | H01L 29/7869 257/43 |
| 2015/0310929 | A1* | 10/2015 | Umezaki ............... | G09G 3/36 345/87 |
| 2016/0149044 | A1* | 5/2016 | Noda .................. | H01L 29/78603 257/43 |
| 2017/0141231 | A1* | 5/2017 | Matsumoto ......... | H01L 29/7869 |

FOREIGN PATENT DOCUMENTS

JP    2012-104639    5/2012

\* cited by examiner

*Primary Examiner* — Dale E Page
*Assistant Examiner* — Wasiul Haider
(74) *Attorney, Agent, or Firm* — Oblon, McClelland, Maier & Neustadt, L.L.P.

(57) ABSTRACT

According to one embodiment, a thin-film transistor and a method of manufacturing the same achieve size reduction of the thin-film transistor while using an oxide semiconductor layer. The oxide semiconductor layer includes a channel region, a source region, and a drain region. A gate electrode is arranged at a position spaced from the channel region of the oxide semiconductor layer so as to face the channel region. A source electrode is electrically connected to the source region of the oxide semiconductor layer. A drain electrode is electrically connected to the drain region of the oxide semiconductor layer. An undercoat layer adjoins the source region and the drain region of the oxide semiconductor layer. A hydrogen blocking layer has a hydrogen concentration lower than that in the undercoat layer and separates the undercoat layer and the channel region of the oxide semiconductor layer.

8 Claims, 1 Drawing Sheet

THIN-FILM TRANSISTOR AND METHOD OF MANUFACTURING THE SAME FIELD

INCORPORATION BY REFERENCE

The present invention claims priority under 35 U.S.C. § 119 to Japanese Patent Application No. 2014-237936 filed on Nov. 25, 2014. The content of the application is incorporated herein by reference in its entirety.

FIELD

Embodiments described herein relate generally to a thin-film transistor including an oxide semiconductor layer and a method of manufacturing the thin-film transistor.

BACKGROUND

A thin-film transistor has conventionally been used in a flat panel display device such as a liquid crystal display device or an organic EL display device. In recent years, a flat panel display device has been required to respond to increasing demands for a larger screen, a higher resolution, and a higher frame rate, etc. Some flat panel display devices use an oxide semiconductor layer that can achieve high mobility as a semiconductor layer of a thin-film transistor. In particular, an oxide semiconductor layer made of IGZO, for example, has gained attention as an oxide semiconductor layer satisfying the aforementioned demands as it can be formed in a large area under a relatively low temperature and consumes a small current.

To reduce the resistance of a source region and that of a drain region of the aforementioned oxide semiconductor layer, this oxide semiconductor layer is formed by a process using hydrogen plasma, for example, in which a gate electrode (gate metal) of a top gate type is used as a mask. However, this plasma process makes it difficult to control the diffusion length of hydrogen. This disadvantageously also reduces the resistance of a channel region, making it difficult to form a thin-film transistor of a short length.

DETAILED DESCRIPTION

A thin-film transistor of the embodiments includes an oxide semiconductor layer, a gate electrode, a source electrode, a drain electrode, a hydrogenated layer, and an insulating hydrogen blocking layer. The oxide semiconductor layer includes a channel region, a source region, and a drain region. The channel region is placed between the source region and the drain region. The gate electrode is arranged at a position spaced from the channel region of the oxide semiconductor layer so as to face the channel region. The source electrode is electrically connected to the source region of the oxide semiconductor layer. The drain electrode is electrically connected to the drain region of the oxide semiconductor layer. The hydrogenated layer adjoins the source region and the drain region of the oxide semiconductor layer. The hydrogen blocking layer has a hydrogen concentration lower than that in the hydrogenated layer. The hydrogen blocking layer separates the hydrogenated layer and the channel region of the oxide semiconductor layer.

The structure of a first embodiment is described below by referring to FIGS. 1 and 2.

Figure 1:
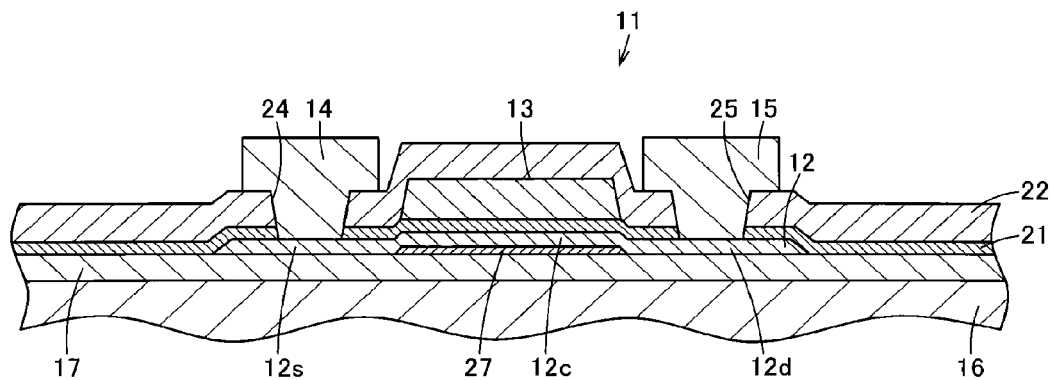
FIG. 1 is a sectional view schematically showing a thin-film transistor of a first embodiment.
Figure 2:
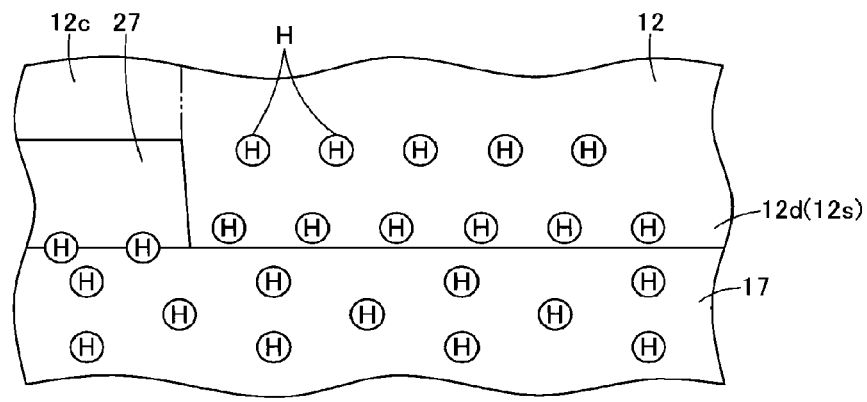
FIG. 2 is a sectional view schematically showing a part of a method of manufacturing the thin-film transistor of the first embodiment.

Referring to FIGS. 1 and 2, 11 shows a thin-film transistor. The thin-film transistor 11 is a top gate type thin-film transistor used in a flat panel display device such as a liquid crystal display device (LCD) or an organic EL display device.

The thin-film transistor 11 includes an oxide semiconductor layer 12, a gate electrode 13, a source electrode 14, and a drain electrode 15. The thin-film transistor 11 is formed on an insulating undercoat layer 17 as a hydrogenated layer formed on a glass substrate 16 as an insulating substrate.

The oxide semiconductor layer 12 is formed of an oxide containing at least one of indium (In), gallium (Ga), zinc (Zn), and tin (Sn), for example. For example, the oxide semiconductor layer 12 may be formed of IGZO. The oxide semiconductor layer 12 has a channel region 12*c* as a high-resistance region of a relatively high resistance formed into a given width in a central part of the oxide semiconductor layer 12. A source region 12*s* and a drain region 12*d* as low-resistance regions lower in resistance than the channel region 12*c* are formed while the channel region 12*c* is placed between the source region 12*s* and the drain region 12*d*.

The gate electrode (gate metal) 13 is formed of an alloy containing one of, or at least one of copper (Cu), aluminum (Al), titanium (Ti), molybdenum (Mo), tungsten (W), tantalum (Ta), and chromium (Cr), for example. The gate electrode 13 is formed on a gate insulating film 21 covering the oxide semiconductor layer 12 at a position facing the channel region 12*c* of the oxide semiconductor layer 12, specifically, at a position directly above the channel region 12*c*. The gate electrode 13 is insulated from the oxide semiconductor layer 12 (channel region 12*c*) and the undercoat layer 17 by the gate insulating film 21. The gate insulating film 21 is a silicon oxide film or a silicon nitride film, for example.

The source electrode 14 and the drain electrode 15 are formed of an alloy containing one of, or at least one of copper (Cu), aluminum (Al), titanium (Ti), molybdenum (Mo), tungsten (W), tantalum (Ta), and chromium (Cr), for example. The source electrode 14 and the drain electrode 15 are formed on an interlayer insulating film 22 that is formed on the gate insulating film 21 so as to cover the gate electrode 13, so that the source electrode 14 and the drain electrode 15 are insulated from the gate electrode 13. Further, the source electrode 14 and the drain electrode 15 are electrically connected to the source region 12*s* and the drain region 12*d* of the oxide semiconductor layer 12 through a contact hole 24 and a contact hole 25 respectively each of which is formed so as to extend through the gate insulating film 21 and the interlayer insulating film 22. In this way, the source electrode 14 and the drain electrode 15 are arranged at positions between which the gate electrode 13 is placed. The interlayer insulating film 22 is a silicon oxide film (SiO), for example.

The undercoat layer 17 is formed so as to cover a surface of the glass substrate 16. The undercoat layer 17 is a silicon nitride film (SiN:H) containing hydrogen H inside that is manufactured by a method described later, for example. The oxide semiconductor layer 12 is formed on the undercoat layer 17 so as to cover a hydrogen blocking layer 27 and to adjoin the undercoat layer 17. Further, the gate insulating film 21 is formed on the undercoat layer 17 so as to adjoin the undercoat layer 17.

The hydrogen blocking layer 27 is to separate the channel region 12c of the oxide semiconductor layer 12 and the undercoat layer 17. The hydrogen blocking layer 27 is a silicon nitride film (SiN) not containing hydrogen inside that is manufactured by a method described later, for example. Specifically, the hydrogen blocking layer 27 is formed so as to have a hydrogen concentration lower than that in the undercoat layer 17 and to have low hydrogen permeability. The hydrogen blocking layer 27 is formed on the undercoat layer 17 at a position below the channel region 12c. As a result, the oxide semiconductor layer 12 contacts (adjoins) the undercoat layer 17 directly in the source region 12s and the drain region 12d while being separated from the undercoat layer 17 through the hydrogen blocking layer 27 in the channel region 12c.

A method of manufacturing the thin-film transistor 11 of the first embodiment is described next.

First, the undercoat layer 17 is formed on a given insulating underlayer such as the glass substrate 16. At this time, the undercoat layer 17 is deposited by a plasma CVD process performed by introducing gas containing at least hydrogen ($H_2$) such as silane ($SiF_4$)/ammonia ($NH_3$)/nitrogen ($N_2$)/hydrogen ($H_2$) gas, for example.

Next, the hydrogen blocking layer 27 is deposited and then patterned on the undercoat layer 17. At this time, the hydrogen blocking layer 27 is formed by a plasma CVD process performed for example by introducing gas containing silane-based gas and not containing hydrogen, specifically, gas other than hydrogen gas. As an example, this plasma CVD process is performed by introducing silane ($SiF_4$)/nitrogen ($N_2$) gas and using a high-density plasma device such as an ICP.

The oxide semiconductor layer 12 is deposited and then patterned on the undercoat layer 17 so as to cover the hydrogen blocking layer 27.

Then, the hydrogen H in the undercoat layer 17 is diffused by thermal diffusion toward the oxide semiconductor layer 12. At this time, in the oxide semiconductor layer 12, the hydrogen H is diffused to places except a place on the hydrogen blocking layer 27, specifically, to regions directly contacting the undercoat layer 17 and between which the hydrogen blocking layer 27 is placed. These regions are each reduced in resistance to form the source region 12s and the drain region 12d. Further, entry of the hydrogen H is blocked (suppressed) by the hydrogen blocking layer 27 into a region and this region becomes the channel region 12c of a high resistance (FIG. 2).

Next, the gate insulating film 21 is deposited on the undercoat layer 17 so as to cover the oxide semiconductor layer 12 and then patterned. The gate electrode 13 is deposited on the gate insulating film 21 by sputtering, for example, and then patterned. If the gate insulating film 21 is to be formed only under the gate electrode 13, the gate insulating film 21 and the gate electrode 13 can be patterned together.

Then, the interlayer insulating film 22 is deposited on the gate insulating film 21 so as to cover the gate electrode 13 and then patterned. Further, the contact holes 24 and 25 are formed for example by etching in each of the gate insulating film 21 and the interlayer insulating film 22 at positions corresponding to the source region 12s and the drain region 12d of the oxide semiconductor layer 12, respectively. A given metal layer is deposited for example by sputtering so as to cover the contact holes 24 and 25 and then patterned for example by etching. As a result, the source electrode 14 and the drain electrode 15 are each formed into an island-shape, for example, so as to be electrically connected to the source region 12s and the drain region 12d, respectively.

As described above, in the first embodiment, the hydrogen blocking layer 27 is formed on the undercoat layer 17 containing the hydrogen H. The oxide semiconductor layer 12 is formed on the undercoat layer 17 so as to cover the hydrogen blocking layer 27. Then, the hydrogen H in the undercoat layer 17 is thermally diffused to the oxide semiconductor layer 12, thereby forming the source region 12s and the drain region 12d. At the same time, entry of the hydrogen H in the undercoat layer 17 is blocked by the hydrogen blocking layer 27 to form the channel region 12c between the source region 12s and the drain region 12d of the oxide semiconductor layer 12. As a result, the length of the channel region 12c (channel length) can be controlled easily. This makes it possible to reduce the length of the channel region 12c to reduce the size of the thin-film transistor 11 while using the oxide semiconductor layer 12 made of IGZO, for example.

Figure 3:
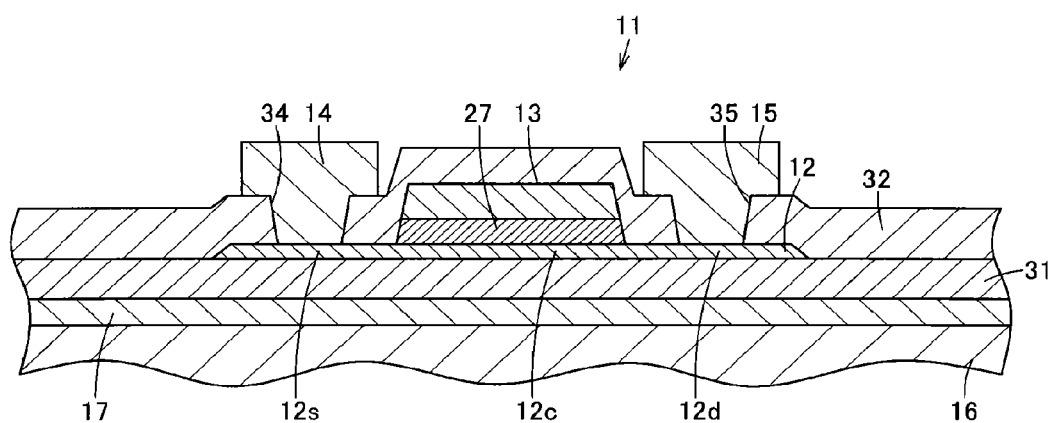
FIG. 3 is a sectional view schematically showing a thin-film transistor of a second embodiment.

A second embodiment is described next by referring to FIG. 3. Structures and functions corresponding to those of the aforementioned first embodiment are identified by the same signs and their description will be omitted.

In the second embodiment, an undercoat layer 31 as a film not containing hydrogen such as a silicon oxide film (SiO) is formed on the undercoat layer 17 of the first embodiment. The oxide semiconductor layer 12 is formed directly on the undercoat layer 31. The hydrogen blocking layer 27 as a gate insulating film and the gate electrode 13 are stacked in order on the oxide semiconductor layer 12. An interlayer insulating film 32 as a hydrogenated layer is formed on the undercoat layer 31 so as to cover the hydrogen blocking layer 27 and the gate electrode 13. Further, the source electrode 14 and the drain electrode 15 are electrically connected to the source region 12s and the drain region 12d of the oxide semiconductor layer 12 through a contact hole 34 and a contact hole 35 respectively formed in the interlayer insulating film 32.

The hydrogen blocking layer 27 is formed on the channel region 12c of the oxide semiconductor layer 12 so as to directly contact the channel region 12c.

The interlayer insulating film 32 is to insulate the gate electrode 13 from the source electrode 14 and the drain electrode 15. The interlayer insulating film 32 is a silicon nitride film (SiN:H) containing hydrogen H inside that is manufactured by a method described later.

For manufacture of the thin-film transistor 11, the undercoat layer 31 is deposited on the undercoat layer 17 formed on the glass substrate 16. The oxide semiconductor layer 12 is deposited and then patterned on the undercoat layer 31 to form an island-shape. Next, the hydrogen blocking layer as a gate insulating film is deposited on the oxide semiconductor layer 12. At this time, like in the first embodiment, the hydrogen blocking layer 27 is formed by a plasma CVD process performed by introducing gas containing silane-based gas such as silane ($SiF_4$)/nitrogen ($N_2$) gas, for example, and using a high-density plasma device such as an ICP, for example.

Further, the gate electrode 13 is deposited on the hydrogen blocking layer 27 by sputtering, for example. Then, the hydrogen blocking layer 27 and the gate electrode 13 are patterned together for example by etching using a mask or the like not shown in the drawings.

Next, the interlayer insulating film 32 is deposited and then patterned on the oxide semiconductor layer 12 including the gate electrode 13 and the hydrogen blocking layer 27 formed on the oxide semiconductor layer 12 and on the undercoat layer 31. At this time, the interlayer insulating film 32 is deposited by a plasma CVD process performed by introducing gas containing at least hydrogen.

Then, the hydrogen H in the interlayer insulating film is diffused by thermal diffusion toward the oxide semiconductor layer 12. At this time, in the oxide semiconductor layer 12, the hydrogen H is diffused to places except a place on the hydrogen blocking layer 27, specifically, to regions directly contacting the interlayer insulating film 32 and between which the hydrogen blocking layer 27 is placed. These regions are each reduced in resistance to form the source region 12s and the drain region 12d. Further, entry of the hydrogen H is blocked (suppressed) by the hydrogen blocking layer 27 into a region and this region becomes the channel region 12c of a high resistance.

Then, the contact holes 34 and 35 are formed for example by etching in the interlayer insulating film 32 at positions corresponding to the source region 12s and the drain region 12d of the oxide semiconductor layer 12, respectively. A given metal layer is deposited for example by sputtering so as to cover the contact holes 34 and 35 and then patterned for example by etching. As a result, the source electrode 14 and the drain electrode 15 are each formed into an island-shape, for example, so as to be electrically connected to the source region 12s and the drain region 12d, respectively.

As described above, in the second embodiment, the hydrogen blocking layer 27 is formed on the oxide semiconductor layer 12 and the gate electrode 13 is formed on the hydrogen blocking layer 27. The interlayer insulating film 32 containing the hydrogen H is formed on the oxide semiconductor layer 12 so as to cover at least the hydrogen blocking layer 27. The hydrogen H in the interlayer insulating film 32 is thermally diffused to the oxide semiconductor layer 12, thereby forming the source region 12s and the drain region 12d. At the same time, entry of the hydrogen H in the interlayer insulating film 32 is blocked by the hydrogen blocking layer 27 to form the channel region 12c between the source region 12s and the drain region 12d of the oxide semiconductor layer 12. As a result, the length of the channel region 12c (channel length) can be controlled easily. This makes it possible to reduce the length of the channel region 12c to reduce the size of the thin-film transistor 11 while using the oxide semiconductor layer 12 made of IGZO, for example.

In each of the aforementioned embodiments, even if the thin-film transistor 11 is a bottom gate thin-film transistor including the gate electrode 13 arranged below the oxide semiconductor layer 12, this thin-film transistor 11 can still be formed in the same way.

According to at least one of the aforementioned embodiments, the hydrogen blocking layer 27 blocks entry of the hydrogen H into the channel region 12c. This enhances reliability and durability in terms of gate bias temperature stress (BTS). As a result, a compact and highly-reliable thin-film transistor can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin-film transistor comprising:
   a substrate;
   an oxide semiconductor layer having an island-shape formed above the substrate and including a channel region, a source region, and a drain region, the channel region being placed between the source region and the drain region;
   an insulating film arranged above the oxide semiconductor layer and having a first contact hole and a second contact hole;
   a gate electrode arranged at a position spaced from an upper side of the channel region of the oxide semiconductor layer so as to face the upper side of the channel region;
   a source electrode electrically connected to an upper side of the source region of the oxide semiconductor layer through the first contact hole;
   a drain electrode electrically connected to an upper side of the drain region of the oxide semiconductor layer through the second contact hole;
   a hydrogenated layer, a part of the hydrogenated layer being disposed between the whole surface of the oxide semiconductor layer and the substrate, and the remaining other part of the hydrogenated layer being disposed outside the oxide semiconductor layer and between the substrate and the insulating film; and
   an insulating hydrogen blocking layer that separates the hydrogenated layer and the channel region of the oxide semiconductor layer, the hydrogen blocking layer having a hydrogen concentration lower than that in the hydrogenated layer, wherein
   the oxide semiconductor layer is disposed between the gate electrode and the hydrogenated layer, and
   the source region and the drain region are reduced in resistance by the hydrogen of the hydrogenated layer.

2. The thin-film transistor according to claim 1, wherein the hydrogen blocking layer is formed on the hydrogenated layer,
   the oxide semiconductor layer is formed on the hydrogenated layer including the hydrogen blocking layer, the channel region is arranged on the hydrogen blocking layer, and each of the source region and the drain region is arranged on the hydrogenated layer.

3. The thin-film transistor according to claim 1, wherein the hydrogenated layer is a silicon nitride film containing hydrogen, and
   the hydrogen blocking layer is a silicon nitride film not containing hydrogen.

4. The thin-film transistor according to claim 1, wherein the oxide semiconductor layer is formed of an oxide containing at least one of indium, gallium, zinc, and tin.

5. The thin-film transistor according to claim 1, wherein:
   the oxide semiconductor layer is formed on the hydrogenated layer so as to cover the hydrogen blocking layer, and
   the source region and the drain region are formed by thermally diffusing hydrogen in the hydrogenated layer to the oxide semiconductor layer and the channel region is formed between the source region and the drain region of the oxide semiconductor layer by blocking entry of the hydrogen in the hydrogenated layer with the hydrogen blocking layer.

6. The thin-film transistor according to claim 5, wherein
the hydrogenated layer is a silicon nitride film formed by
   introducing hydrogen, and
the hydrogen blocking layer is a silicon nitride film
   formed by introducing gas other than hydrogen gas.

7. The thin-film transistor according to claim 6, wherein
the hydrogen blocking layer is formed by a plasma CVD
process performed by introducing gas containing silane and
using a high-density plasma device.

8. The thin-film transistor according to claim 5, wherein
the oxide semiconductor layer is formed of an oxide containing at least one of indium, gallium, zinc, and tin.

* * * * *